US011385261B2

(12) United States Patent
Niemann (10) Patent No.: US 11,385,261 B2
(45) Date of Patent: Jul. 12, 2022

(54) TEST AND MEASUREMENT INSTRUMENT HAVING OVERPULSED POWER SUPPLY AND CONTROLLED SLEW RATE

(71) Applicant: Keithley Instruments, LLC, Solon, OH (US)

(72) Inventor: James A. Niemann, Chagrin Falls, OH (US)

(73) Assignee: Keithley Instruments, LLC, Solon, OH (US)

(*) Notice: Subject to any disclaimer, the term of this patent is extended or adjusted under 35 U.S.C. 154(b) by 439 days.

(21) Appl. No.: 16/664,672

(22) Filed: Oct. 25, 2019

(65) Prior Publication Data
US 2020/0132726 A1 Apr. 30, 2020

Related U.S. Application Data

(60) Provisional application No. 62/751,340, filed on Oct. 26, 2018.

(51) Int. Cl.
*G01R 1/30* (2006.01)
*H03F 3/68* (2006.01)

(52) U.S. Cl.
CPC ............... *G01R 1/30* (2013.01); *H03F 3/68* (2013.01); *H03F 2200/129* (2013.01); *H03F 2200/393* (2013.01)

(58) Field of Classification Search
CPC . G01R 1/30; G01R 1/28; G01R 29/02; G01R 31/00; G01R 31/40; H03F 3/68; H03F 2200/129; H03F 2200/393; H03F 2203/45248; H03F 3/45475; H02M 1/08; H02M 3/158
USPC .................................. 324/124, 123 R, 76.11
See application file for complete search history.

(56) References Cited

U.S. PATENT DOCUMENTS

| 10,591,522 B2* | 3/2020 | Held ...................... G01R 15/12 |
| 11,125,647 B2* | 9/2021 | Champavere ........ H04B 10/071 |
| 2017/0061045 A1* | 3/2017 | Okuyama .......... G01R 31/2848 |

\* cited by examiner

*Primary Examiner* — Giovanni Astacio-Oquendo
(74) *Attorney, Agent, or Firm* — Miller Nash LLP; Andrew J. Harrington (57) ABSTRACT

A power supply in a test and measurement device includes a stimulus having an output coupled to an amplifier in which an output signal from the stimulus controls an output level of the amplifier. The stimulus may include a Digital to Analog Converter. A measurement circuit detects the output level of the amplifier. The power supply includes an overpulse generator that can be structured to accept a desired amplifier output level, overdrive the stimulus at a first level for a first time period, and drive the stimulus at a second level for a second time period. The measurement circuit determines when the overpulse generator switches from driving the stimulus at the first level to driving the stimulus at the second level. The time period for driving the stimulus at the second level starts as the actual amplifier output level approaches the desired amplifier output level.

20 Claims, 8 Drawing Sheets

TEST AND MEASUREMENT INSTRUMENT HAVING OVERPULSED POWER SUPPLY AND CONTROLLED SLEW RATE

FIELD OF THE INVENTION

This disclosure is directed to test and measurement devices, and, more particularly, to test and measurement devices having an overpulsed power supply for generating an output source current or an output source voltage having minimized transition times.

BACKGROUND

Figure 1:
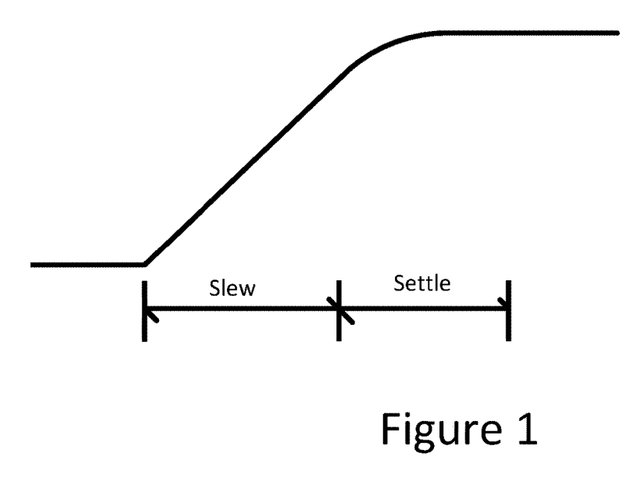
FIG. 1 is a time graph illustrating two portions of output transition times.

When power supplies change output power levels, they have a period referred to as transition time where the output level is neither at the original level nor the target level. As illustrated in FIG. 1, a transition time may include a slew portion, when the output device is changing state at a predetermined and relatively continuous rate, and a settling portion, when the output device is nearing the target output level. For some devices, long settling times are not a problem, as the device receiving power merely waits until the supplied power is stabilized at the correct power level. Typical power supplies require 10 ms to 100 ms settling time, while typical Source Measuring Units (SMUs) settle in approximately 100 μs. Pulse Measuring Units (PMUs) may settle in as little as 10 ns, but generally lack closed loop current or voltage control.

Many new devices, such as devices connected to the internet, have multiple different power requirements based on changing states. For instance, an always-listening speaker may have a resting state that draws little power, but changes to an active state upon recognizing a wake-word. For some devices, the active state may exist for only a very short time, such as 100 ns, after which the power is again reduced. The magnitude of the power required at different states may vary widely, which also increases transition time, as a large transition in output nearly always takes longer than a shorter one.

General purpose power supplies need to serve many applications, where different applications may include a different load reactance. For this reason, power supplies have the lowest bandwidth of each instrument class. This allows them to work with the wide range of loads and remain stable, although transition times may be the longest. The SMU bandwidth is higher, yet in many situations an SMU also serves as a power supply having additional precision.

Known power supplying devices provide increased bandwidth or speed by designing additional closed loop bandwidth in the supply circuit. These known techniques, however, have a fundamental speed limit due to bode frequency response issues. The interaction between the supply output, attached cables, and a coupled Device Under Test (DUT) create a phase that compromises the amplifier stability.

Embodiments of the invention address these and other issues of known solutions.

BRIEF DESCRIPTION OF THE DRAWINGS

Aspects, features and advantages of embodiments of the present disclosure will become apparent from the following description of embodiments in reference to the appended drawings in which.

DESCRIPTION

Embodiments of the invention include power supplying circuits with amplifiers that have a very short transition period when changing output levels. These power supplying circuits minimize both the slew and settle time periods. These amplifiers may be temporarily driven with an input pulse that is much larger than an input pulse required for the final desired output. The large magnitude initial input pulse causes the amplifier to enter the slew period quickly, and to remain in the slew period for the majority of the transition time. The amplifier output is monitored and, when the amplifier output nears the final desired output, without overshooting the desired output, the input pulse drops to the correct input that matches the desired output, and the amplifier stabilizes at the desired output. In this way, the amplifier minimizes transition time by maximizing the portion of the transition that the amplifier is in slew, and minimizes the settling time.

During a standard transition period, the transition time is the sum of the slew rate time and the settling time, as illustrated in FIG. 1. This figure represents either a change in voltage or a change in current over a transition time period. In such an amplifier, the slew rate is a function of the input error voltage or error current, the fixed forward loop gain, and a built in "maximum" slew rate of the amplifier, such as those in known SMU amplifiers. Notice that after a large step during the slew period, as the amplifier nears the set point, the error and resultantly the slew diminishes, and the amplifier begins to settle according to the amplifiers small signal bandwidth. One problem with prior art amplifiers is that, as the error diminishes, so does the rate at which the amplifier settles. The smaller error associated with the settling period multiplied by the gain will no longer saturate the forward gain into the slew limiting condition. The settling works under the full forward gain/bandwidth while the slew period, i.e., the period when the amplifier is saturated, operates with a minimum amplifier gain/bandwidth. The prior art amplifiers, which typically have high closed-loop bandwidths, tend to oscillate due to the phase created by the maximum amplifier gain/bandwidth, e.g., during the settling period, which was not present during the slewing period.

Embodiments of the invention, differently, drive the amplifier with an overpulsed input that causes the amplifier to stay in its slew period for the majority of the entire transition period. Only after nearing the desired output voltage or current does the input reduce to the level for holding the amplifier at its desired output. Since, under this scenario, the majority of the transition time is spent in the slew portion of the transition, the settling portion of the transition is minimal, or even zero when the amplifier exits the slew portion exactly at the set point. One benefit of this solution is that it allows the use of a relatively low speed amplifier, since it is well-behaved into reactive loads.

Embodiments of the invention include controlling three attributes of amplifiers that do not directly change the amplifier bandwidth. These attributes are also linearly independent. The first attribute is an output impedance of the final output stage. The second attribute is an overall amplifier slew rate. And the third attribute is the amplifier input/output overhead voltage.

Figure 2:
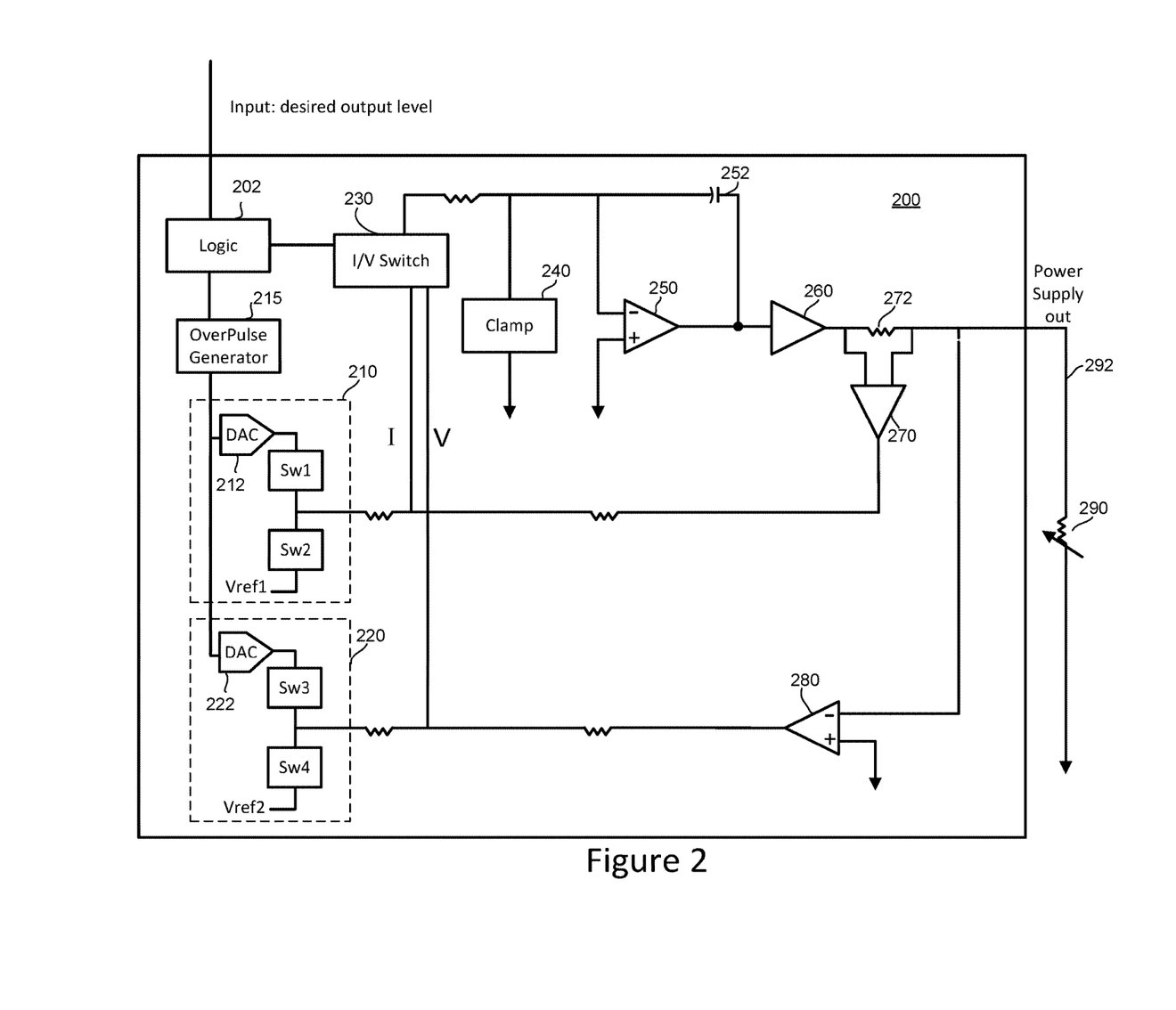
FIG. 2 is a block circuit diagram of a power supply circuit that uses overpulsing according to embodiments of the invention.

FIG. 2 is a block circuit diagram of a power supply circuit 200 according to embodiments of the invention. The power supply circuit 200 illustrated in FIG. 2 includes two stimulus generators 210, 220. The stimulus generator 210 generates an electrical current output based on an input, which may be a digital input. The stimulus generator 220 generates an electrical voltage output based on an input, which likewise may be a digital input. In the power supply circuit 200, the stimulus generators 210, 220 have a high bandwidth and high slew rate compared to conventional generators.

In some embodiments the stimulus generator 210 includes a Digital to Analog Converter (DAC) 212. The DAC 212 may be driven by an overpulse generator 215, described below, to cause the stimulus generator 210 to output a desired current. This output current of the stimulus generator 210 is amplified to be the output of the power supply 200. Thus, driving the DAC 212 at the correct level causes the power supply 200 to output the desired current level.

The stimulus generator 210 may also include a pair of switches, SW1 and SW2, with the output of the stimulus generator 210 coupled between the pair. Turning SW1 ON and SW2 OFF couples the output of the stimulus generator 210 to the output of the DAC 212. Conversely, turning SW1 OFF and SW2 ON couples the output of the stimulus generator 210 to a reference voltage Vref1. As described below, in some embodiments the switches SW1 and SW2 are controlled to couple the output of the stimulus generator 210 initially to a particular reference voltage Vref1, and then later control the switches SW1 and SW2 to couple the output of the stimulous generator to a current controlled by the output of the DAC 212. Also, in some embodiments the Vref1 may be generated by another DAC (not illustrated).

The stimulus generator 220 operates in the same manner, except the stimulus generator 220 generates an output voltage, rather than an output current. Also similarly, Vref2 may be generated by a separate DAC within the stimulus generator 220.

The DACs 212, 222 may be fine resolution DACs, which allows them to be controlled more precisely with time, to achieve shorter pulses and finer control.

Figure 3:
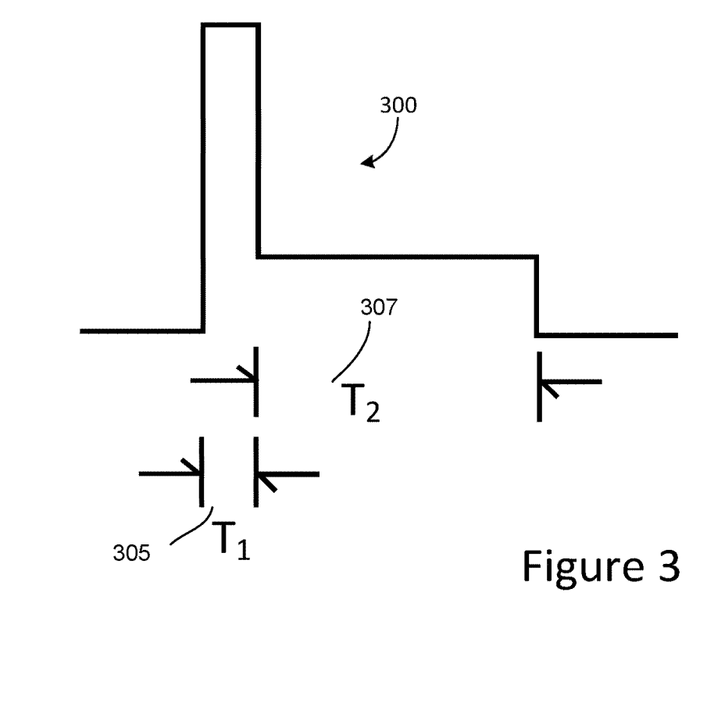
FIG. 3 is a graph illustrating an overpulse input to an amplifier according to embodiments of the invention.

The stimulus generators 210, 220 are driven by an overpulse generator 215. The control signal from the overpulse generator 215 may be a digital input driving signal, such as the digital input illustrated in FIG. 3. The digital input signal in FIG. 3 is an overpulsed signal 300, meaning that it has an initial value during a first time period $T_1$ that is much higher than a subsequent value during a second time period $T_2$. This overpulsing causes the amplifier, described below, to remain in its maximum slew rate for much longer than it takes the amplifier to settle. Driving the DACs 212, 222 by an overpulsed signal allows the output of the power supply 200 to achieve its desired level in a very short time, and a shorter time than if the input to the DACs 212, 222 were constant. The control signal from the overpulse generator 215 may also include signals to control operation of Switches SW1, SW2, SW3, and SW4, as described above. In some embodiments, the overpulsed signal 300 may be a negative signal rather than the positive signal illustrated in FIG. 3.

In some embodiments, the overpulse generating circuit, or overpulse generator 215 is responsible for generating the overpulsed signal 300 and providing it to the particular stimulus generator 210, 220. The selection of the desired output level of the power supply circuit 200 may be made directly by a user, such as by entering a desired voltage from a menu. In other cases the desired output level may be a calculated output based on a predetermined testing procedure. In either case, in general, the overpulse generating circuit 215 accepts the desired level for the output of the power supply circuit 200, then generates a signal for driving either of the stimulus generators 210, 220 so that the output of the stimulus generators causes the power supply circuit 200 to generate the desired output level. In embodiments of the invention, the overpulse generating circuit 215 may generate an overpulsed signal, such as the overpulsed signal 300 of FIG. 3, which causes the power supply circuit 200 to change from a present output level to the desired output level very quickly. The change happens quickly because the overpulsed input signal to the stimulus generator, or the DAC within the generator initially causes the power supply circuit 200 to increase or decrease its output very rapidly, at a rate much faster than if the DAC were driven with a non-overpulsed signal. Then, after approaching the desired output of the power supply circuit 200, the overpulse generating circuit 215 reduces its output, and thus the input to the DAC, to a level appropriate for maintaining a relatively constant output of the power supply for the desired duration. With reference to FIG. 3, the overpulsed portion of the overpulsed signal 300 is illustrated during time period $T_1$, while the standard portion of the signal, i.e., the input signal to the DAC 210, 220 that causes the desired steady-state output of the power supply circuit 200 is illustrated at time period $T_2$. The overpulsed signal 300 illustrated in FIG. 3 is merely an example, and the particular initial height of the pulse, as well as the duration of $T_1$, is determined by the overpulse generation circuit 215 acting on data from its inputs. For example, the initial height of the overpulsed signal 300 is selected to drive the power supply circuit 200 as quickly as possible in the direction of the desired output of the power supply, while staying within the operating parameters of the power supply 200. As described below, a monitoring circuit monitors the output of the power supply 200 and provides an indication of the output of the power supply 200 back to the overpulse generator 215, either directly, or through an I/V switch 230, also as described below. When the monitoring circuit determines that the output of the power supply is near or at the desired output, the overpulse generator 215 lowers the overpulsed signal 300 to a non-overpulsed level, such as illustrated in $T_2$ of FIG. 3. In one embodiment, the duration of $T_1$ is based on the slew rate and rise time of the power supply, while the duration of $T_2$ is based on how long the desired output of the power supply 200 is to be maintained. For example, if the desired output of the power supply 200 is to increase rapidly and then remain at a constant current, or voltage, for a long time, the ratio of $T_1$ to $T_2$ is relatively small. Also, in the relative levels of the overpulsed signal 300 illustrated in FIG. 3 during times $T_1$ to $T_2$ are merely exemplary, and the levels of the overpulsed signal during different time periods of operation may be determined by several factors. As described above, the initial height of the overpulsed signal 300 during time $T_1$ may be determined by the maximum slew rate of the power supply 200, while the height of the overpulsed signal 300 during time $T_2$ may be determined by the desired output of the power supply 200.

In some embodiments, $T_1$ may be less than 10 µs, and preferably less than 5 µs, and more preferably between 1-5 µs.

The power supply circuit 200 may include a logic portion 202 that controls the operation of the power supply 200. The logic portion 202 receives the desired output level for the power supply 200 and causes the overpulse generator 215 to control the stimulus generators 210, 220 and their respective DACs 212, 222. The logic portion 202 may also include logic to control an UV switch 230, described below. The logic portion 202 may also control other portions of the power supply 200, such as the measuring circuits structured to measure the output of the power supply 200, also as described below. The logic portion 202 is capable of controlling any portion of the power supply 200 to generate the desired outcome.

As described above, the power supply circuit 200 may also include the UV switch 230 that selects whether the power supply circuit is operating in current mode or voltage mode. In either case, a voltage clamping circuit 240 may be included to provide a predictable and programmable slew rate for the power supply circuit 200. The voltage clamping circuit is coupled to ground, which may be a floating ground. The power supply circuit 200 is designed to have a loop closure rate that is low enough to prevent bode oscillations when the power supply circuit 200 is coupled to external devices.

A first amplifier 250 and a second amplifier 260 form the main gain stage of the power supply circuit 200. Both the amplifiers 250, 260 have a relatively high slew rate, for example 3-10× conventional rates, where conventional rates may be on the order of 30-50 µs. Further, the amplifier 260 has a very low or ultra-low output impedance, which contributes to the very short settling times during output transitions, as described below. In some embodiments the output impedance of the amplifier 260 may be less than 100 milliohms, preferably less than 30 milliohms, and more preferably between 10-30 milliohms.

The overall amplifier section including the first amplifier 250 and second amplifier 260 should have an overall amplifier slew rate that works in concert with the amplifier overhead so that a higher overall amplifier slew rate can be achieved. The slew rate of an amplifier depends on the amplitude of the input step, loop gain, and the built-in amplifier slew rates, all of which are factors in creating the first amplifier 250 and second amplifier 260.

A current measurement amplifier 270 measures the output current of the power supply 200, while a voltage measurement amplifier 280 measures the output voltage of the power supply. These amplifiers 270, 280 may be referred to collectively as the monitoring amplifiers, which may be a part of a monitoring circuit. Each of the measurement amplifiers 270, 280 are used by the power supply 200 to measure the precise output of the power supply, depending on whether the power supply is operating in voltage or current mode. Then, once the desired output voltage or current has been achieved, the monitoring amplifiers send a signal that causes the overpulse generator 215 to reduce from the overpulsed portion of the driving pulse to the typical level i.e., no longer overpulsed, used to maintain the output of the power supply 200 at the desired level. As described above, the overpulse generator 215 changes the level of the driving pulse by controlling the switches within the respective stimulus generator 210, 220, and/or the respective DACs 212, 222.

The output of the second amplifier 260, which is also the output of the power supply 200, may be coupled to a Device Under Test (DUT) 290, typically through a cable 292 that couples the power supply, or the SMU or PSU containing the power supply, to the DUT 290.

As described above, one of the factors that allows such precise and fast transitions of a power supply between different power settings according to embodiments of the invention is by providing a very low or ultra-low output impedance. The amplifier output impedance, however, should also be considered in light of the impedance of the DUT 290 as well as the cable that connects the power supply to the DUT. In some embodiments the DUT 290 may have an impedance of 0.1-10 Ohms.

The amplifier output impedance interacts with the cable 292 as well as the DUT 290. Mismatch of this interaction may increase settling times. Two factors dominate this interaction. The first factor is cable length of the cable 292, where an electrically short cable is desired, such as less than 1 meter. Having a short cable 292 that couples the power supply 200 to the DUT 292 allows many source/DUT reflection cycle to take place during the amplifier slew, or expected step disturbance. The second factor is that the amplifier output impedance should be a small fraction of the DUT 290 impedance. If the DUT 290 has much higher impedance than the amplifier output, then the DUT is exposed only to the low output impedance of the second amplifier 260, which will accurately transmit a source step to the load, or control the output voltage error from a load current disturbance. If the cable 292 is very short, such that many reflections take place within the rise time of the source step, the output signal transition completes quickly. It is also helpful for the impedance of the cable 292 to closely match the DUT 290 impedance. Any mismatch defines the magnitude of the correction that takes place during the multiple reflections, which is why it is preferably minimized. Note that the cable 292 is preferably not series terminated with a resistor at the source to control these reflections, as this resistance would define the droop for a load disturbance.

The examples described above considered only those source/load changes that are slow enough when the cable is electrically short. For higher slew rate load disturbances, such as source steps, there is not much concern since the source oversees these rates of change. For faster load changes where the cable is no longer electrically short, the load error will be equal to the step current multiplied by the impedance of the cable. To improve this condition, a shorter cable for the load edge rate may be used. This new cable will now be electrically short. Also, a lower impedance cable may be used to control the magnitude of the error. Further, the condition may be improved by adding a capacitor at the end of the cable to control the error caused from the step-in load current.

The over-step duration may be a calibrated for specific step amplitudes, or, as described above an illustrated in FIG. 2, the power supply circuit 200 may include current and/or voltage feedback pathways so that the output may be monitored and used to control the input.

In an example, consider applying a 1V, 100 ns pulse, with 10 ns edges defining the pulse, to a 1 ohm load. To accomplish this, the stimulus generator 220 is overpulsed, such as, for example, the overpulsed digital signal 300 of FIG. 3, to keep the low bandwidth amplifier 250, 260 in slew limit all the way to the setpoint, i.e., the desired output level.

The output of the amplifier 260 may be monitored by the monitoring amplifier 270, 280 to determine when the setpoint is met. Just as the setpoint is reached, or just before the setpoint is reached, for example, according to a linear calibration, the input to the stimulus generator 220 is reduced to the standard level to cause the desired output. Any residual error, which will be small, will settle according to the amplifier closed loop bandwidth. Since the cable 292 is electrically short when compared to the 10 ns slew rate, such as 0.1 meters, and since the output impedance is much lower than the 1 Ohm DUT, the pulse will be delivered directly to the load.

Figure 4:
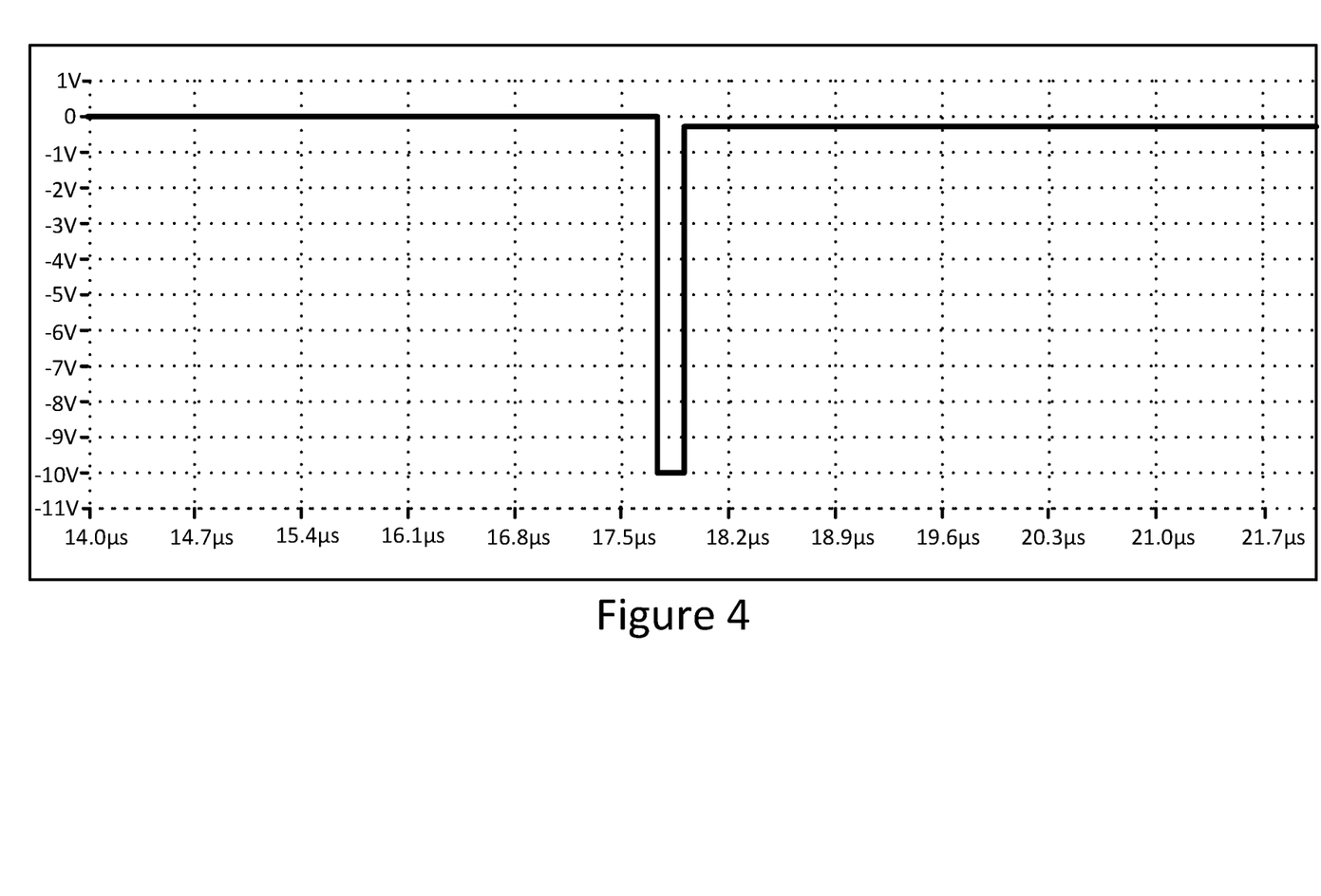
FIG. 4 is a voltage vs. time graph illustrating an overpulse input to an amplifier according to embodiments of the invention.
Figure 5:
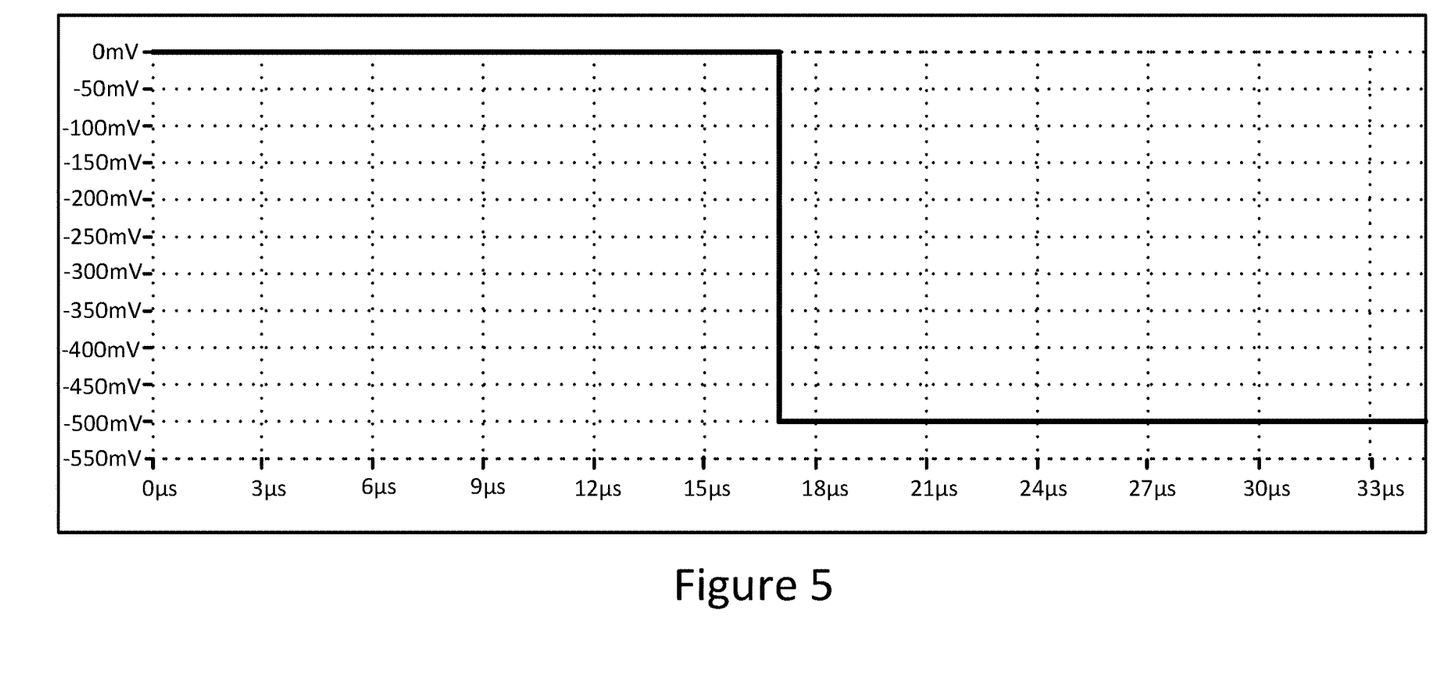
FIG. 5 is a voltage vs. time graph illustrating an output of the amplifier that received the input overpulse of FIG. 4.

FIG. 4 is a voltage vs. time graph illustrating an overpulse input signal that may be generated by the overpulse generator 215 of FIG. 2 and presented to the DUT, such as the stimulus generator 210 or 220 of FIG. 2. Specifically, as illustrated, the input of the overpulse signal begins at 0 Volts, then drops to −10 Volts as a short-duration overpulse, then quickly rises to approximately −0.25 Volts, which is the input to the DAC that causes the power supply to sustain the correct level of output of the amplifier. FIG. 5 illustrates the corresponding output of the power supply 200, or of the amplifier stage within the power supply 260, which drops from 0 mV to −500 mV very quickly around the time 18 ms, which tracks the overpulsed input voltage of FIG. 4.

Figure 6:
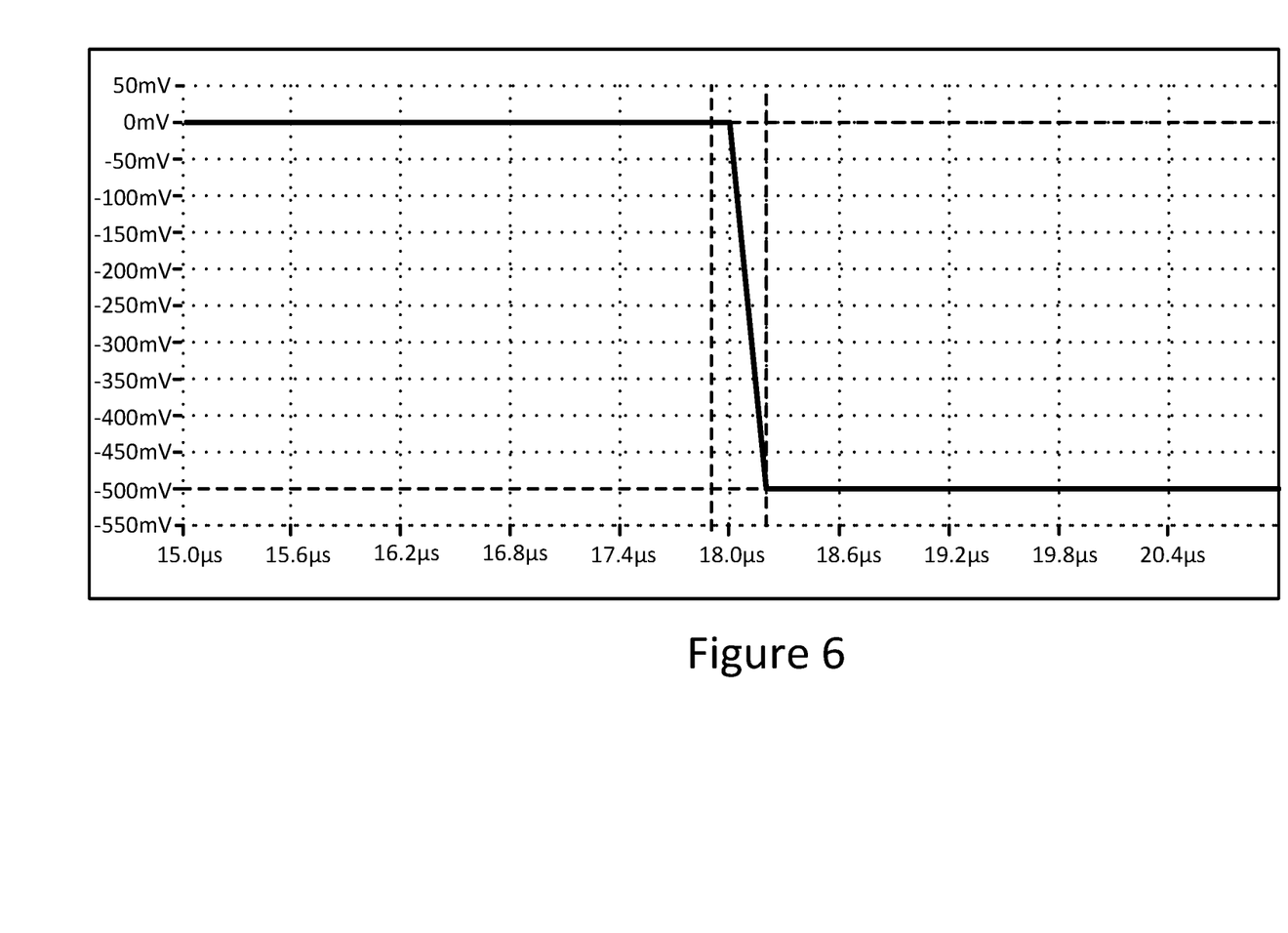
FIG. 6 is a voltage vs. time graph having an expanded view of the output illustrated in FIG. 5.

FIG. 6 is an enlarged view of the transition of FIG. 5, which illustrates how quickly the amplifier 260 transitions from the initial output to the final output, and also illustrates that transition period is mostly linear, i.e., remains for the majority of the transition time in the slew portion.

Figure 7:
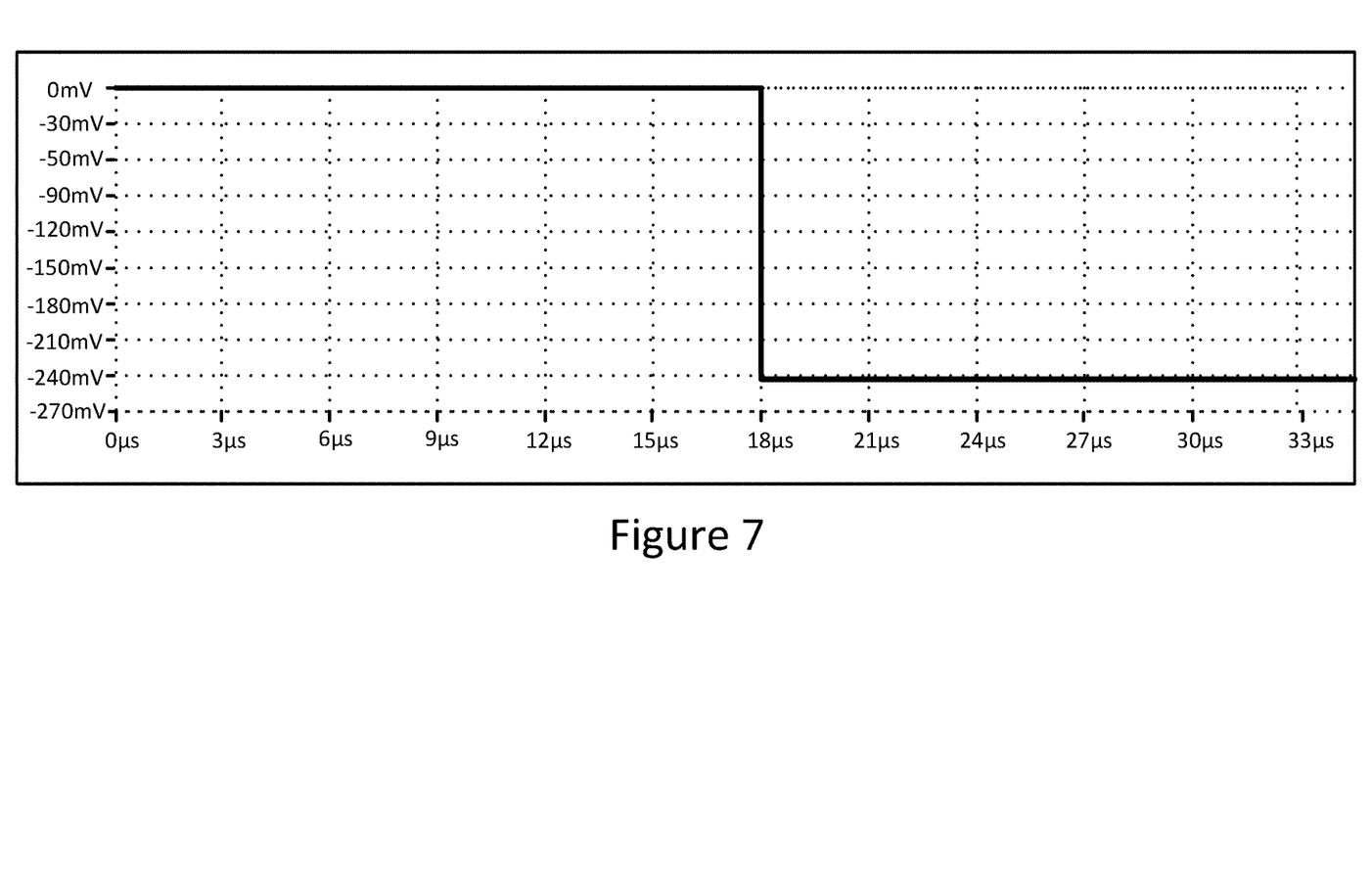
FIG. 7 is a voltage vs. time graph illustrating a non-overpulsed input to an amplifier, in contrast to FIG. 4.
Figure 8:
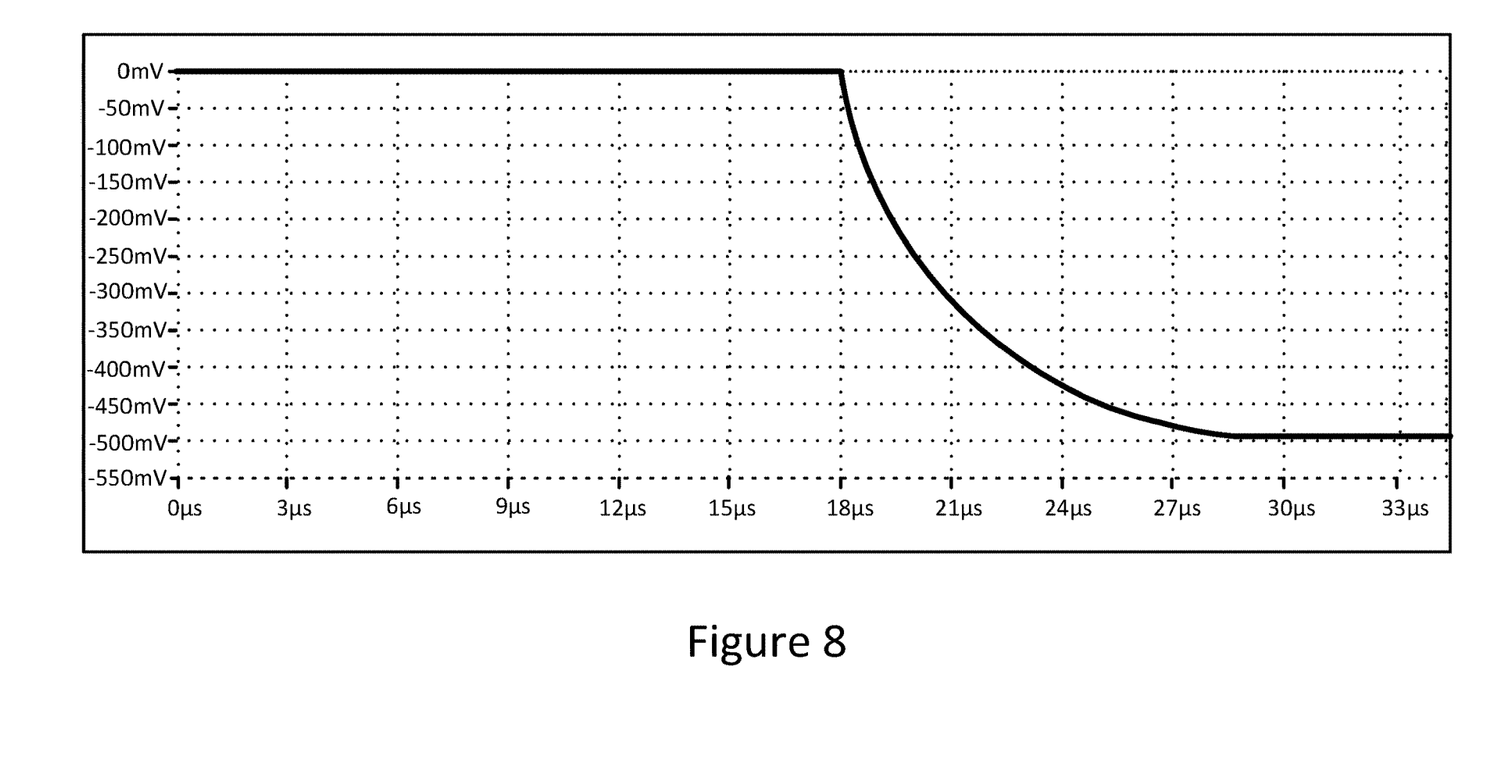
FIG. 8 is a voltage vs. time graph illustrating an output of the amplifier that received the input pulse of FIG. 7, in contrast to the graph illustrated in FIG. 5.

FIGS. 7 and 8 show contrast to FIGS. 4 and 5 above. Specifically, FIG. 7 illustrates a non-overpulsed input presented to a DAC of a power supply. The input of FIG. 7 changes from 0 v to −250 mV. Note that this input is not overpulsed, contrary to the example illustrated with reference to FIGS. 4-6 above. Instead, in this example of a conventionally driven amplifier, a −250 mV input is the desired input to the DAC of the power supply used to sustain the desired output of the power supply at −500 mV. FIG. 8 shows the output voltage from the power supply that was based on the input voltage from FIG. 7. The timescales for FIGS. 5 and 8 are the same. Note how much longer the output takes to transition from 0 V to −500 mV than did the transition of FIG. 5, which incorporated the overpulsing embodiments of the invention.

Figure 9:
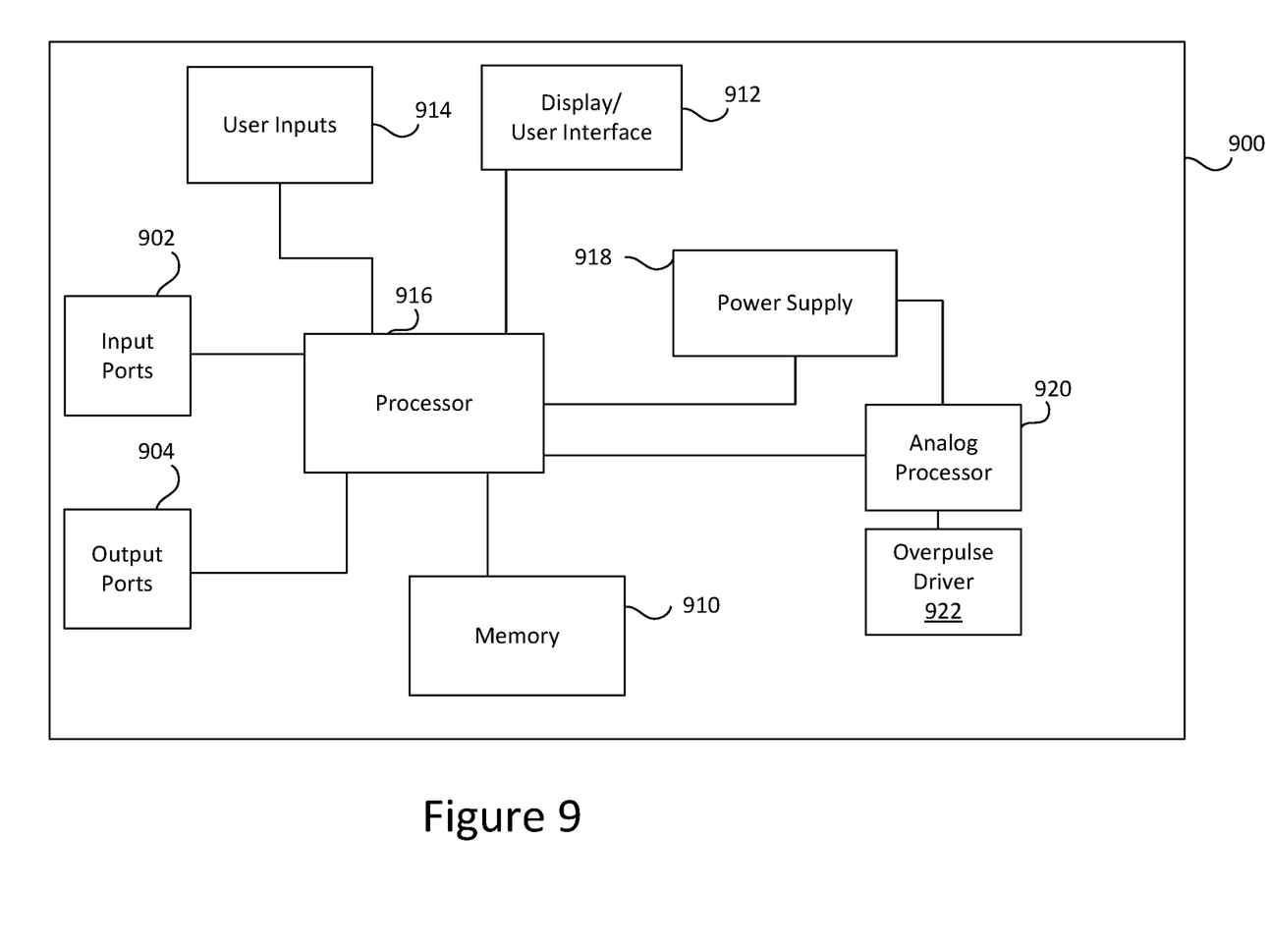
FIG. 9 is a schematic block diagram of a test and measurement instrument on which embodiments of the invention may operate.

FIG. 9 is a block diagram of an example test and measurement instrument 900, such as a SMU, for implementing embodiments of the disclosure as disclosed herein. The test and measurement instrument 900 includes one or more input ports 902 and one or more output ports 904 which may be any electrical signaling medium. Ports 902, 904 may include receivers, transmitters, and/or transceivers. Input ports 902 are used to receive signals from an attached device, such as a DUT, a circuit, a discrete device or set of devices, or other object being tested. Output ports 904 are used to carry generated signals out of the instrument 900 to be applied to a device or a DUT. Examples of output signals include waveforms as well as constant currents and voltages, and may be applied to the device or devices being tested. In some embodiments the output signal is a voltage or current that is desired to be changed very rapidly. Each input port 902 may represent a channel of the test and measurement instrument 900. The input ports 902 are coupled with one or more processors 916 to process the signals and/or waveforms received at the ports 902 from one or more devices under test. Output ports 904 may be coupled to the processor 916, or other components within the instrument 900 that generate the appropriate output signals. Although only one processor 916 is shown in FIG. 9 for ease of illustration, as will be understood by one skilled in the art, multiple processors 916 of varying types may be used in combination, rather than a single processor 916. The processor 916, or other components of the instrument 900 may be connected to a power supply 918, which may be an embodiment of the power supply 200 of FIG. 2, and is connected to or includes an analog processor 920 and an overpulse driver 922. In some embodiments the power supply 918 may be coupled to the output ports 904, and may also be controlled by the processor 916.

The input ports 902 can also be connected to a measurement unit within the test instrument 900, which is not depicted for ease of illustration. Such a measurement unit can include any component capable of measuring aspects (e.g., voltage, amperage, amplitude, etc.) of a signal received via the input ports 902. The output ports 904 can also be connected to various components of the instrument 900, such as the power supply 918, and/or one or more waveform generators, which are not depicted for ease of illustration. The test and measurement instrument 900 may include additional hardware and/or processors, such as conditioning circuits, an analog to digital converter, and/or other circuitry to convert a received signal to a waveform for further analysis. The resulting waveform can then be stored in a memory 910, as well as displayed on a display 912.

The one or more processors 916 may be configured to execute instructions from memory 910 and may perform any methods and/or associated steps indicated by such instructions, such as displaying values measured to a coupled device according embodiments of the disclosure. Memory 910 may be implemented as processor cache, random access memory (RAM), read only memory (ROM), solid state memory, hard disk drive(s), or any other memory type. Memory 910 acts as a medium for storing data, computer program products, and other instructions.

User inputs 914 are coupled to the processor 916. User inputs 914 may include a keyboard, mouse, trackball, touchscreen, and/or any other controls employable by a user to with a User Interface on the display 912. The display 912 may be a digital screen, a cathode ray tube based display, or any other monitor to display waveforms, measurements, and other data to a user. While the components of test instrument 900 are depicted as being integrated within test and measurement instrument 900, it will be appreciated by a person of ordinary skill in the art that any of these components can be external to test instrument 900 and can be coupled to test instrument 900 in any conventional manner (e.g., wired and/or wireless communication media and/or mechanisms). For example, in some embodiments, the display 912 may be remote from the test and measurement instrument 900.

Aspects of the disclosure may operate on particularly created hardware, firmware, digital signal processors, or on a specially programmed computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. An embodiment of the technologies may include any one or more, and any combination of, the examples described below.

Example 1 a power supply in a test and measurement device that includes a stimulus generator having an output coupled to an amplifier in which an output signal from the stimulus generator controls an output level of the amplifier; a measurement circuit coupled to an output of the amplifier and structured to measure the amplifier output level; an overpulse generator coupled to the stimulus generator and to the measurement circuit, the overpulse generator structured to: accept a desired amplifier output level; drive the stimulus generator at a first level for a first time period; and drive the stimulus generator at a second level for a second time period immediately subsequent to the first time period, the first level having a greater magnitude than the second level.

Example 2 is a power supply according to Example 1 in which the desired amplifier output level remains constant during the first time period and the second time period, and in which the second time period starts as the actual amplifier output level approaches the desired amplifier output level.

Example 3 is a power supply according to Examples 1 and 2, in which the duration of first time period corresponds to a duration of a slew period of the amplifier.

Example 4 is a power supply according to Example 1, 2, and 3, in which the stimulus generator comprises a Digital to Analog Converter.

Example 5 is a power supply according to any of Examples 1-4, in which the stimulus generator comprises a Digital to Analog Converter, a first switch structured to selectively couple an output of the Digital to Analog Converter to a stimulus output, and a second switch structured to selectively couple the stimulus output to a reference voltage.

Example 6 is a power supply according to any of Examples 1-5, in which the stimulus generator is a voltage generator, and further comprising a current stimulus generator having an output coupled to the amplifier, the current stimulus generator structured to cause the power supply to generate a current level based on the desired amplifier output level.

Example 7 is a power supply according to claim 6, in which the current stimulus generator comprises a Digital to Analog Converter, a first switch structured to selectively couple an output of the Digital to Analog Converter to a stimulus output, and a second switch structured to selectively couple the stimulus output to a reference voltage.

Example 8 is a power supply according to any of Examples 1-7, in which the measurement circuit comprises a voltage measuring circuit structured to measure a voltage of the amplifier output; and a current measuring circuit structured to measure a current of the amplifier output.

Example 9 is a power supply according to any of Examples 1-8, in which the magnitude of the first level is at least 5 times the magnitude of the second level.

Example 10 is a power supply according to any of Examples 1-9, in which the magnitude of the first level is at least 40 times the magnitude of the second level.

Example 11 is a power supply according to any of Examples 1-10, in which the desired amplifier output level is user selected.

Example 12 is a power supply according to any of Examples 1-11, in which the desired amplifier output level is determined by a processor and without user intervention.

Example 13 is a method of driving an amplifier within a power supply of a test and measurement device, the power supply including a stimulus coupled to an amplifier in which an output of the stimulus controls an output level of the amplifier, the method including accepting a desired output level for the power supply; driving the stimulus at a first level for a first time period; measuring the output level of the power supply; and when the measured output level of the power supply approaches the desired output level for the power supply, driving the stimulus at a second level by the overpulse generator for a second time period immediately subsequent to the first time period, the first level having a greater magnitude than the second level.

Example 14 is a method of driving an amplifier within a power supply of a test and measurement device according to Example 13, in which driving the stimulus at a first level comprises coupling an output of the stimulus to a reference voltage.

Example 15 is a method of driving an amplifier within a power supply of a test and measurement device according to Example 13 or 14, in which driving the stimulus at a second level by the overpulse generator for a second time period comprises: disconnecting the stimulus output from the reference voltage; and connecting the stimulus output to a Digital to Analog Controller driven by the overpulse generator.

Example 16 is a method of driving an amplifier within a power supply of a test and measurement device according to any of Examples 13-15, in which driving the stimulus at a first level comprises driving a voltage controlling DAC, and in which measuring the output level of the power supply comprises measuring an output voltage of the power supply.

Example 17 is a method of driving an amplifier within a power supply of a test and measurement device according to any of Examples 13-16, in which driving the stimulus at a first level comprises driving a current controlling DAC, and in which measuring the output level of the power supply comprises measuring an output current of the power supply.

Example 18 is a method of driving an amplifier within a power supply of a test and measurement device according to any of Examples 13-17, in which driving the stimulus at a first level comprises driving the stimulus at a level that is at least 5 times the magnitude of the second level.

Example 19 is a method of driving an amplifier within a power supply of a test and measurement device according to any of Examples 13-18, in which accepting a desired output level for the power supply comprises accepting a user input.

Example 20 is a method of driving an amplifier within a power supply of a test and measurement device according to any of Examples 13-19, in which accepting a desired output level for the power supply comprises accepting a level predetermined by a processor.

Example 21 is a test system including a test and measurement device having a power supply including a Digital to Analog Converter (DAC) having an output coupled to an amplifier in which an output signal from the DAC controls an output level of the amplifier, a measurement circuit coupled to an output of the amplifier and structured to measure the amplifier output level, an overpulse generator coupled to the DAC and to the measurement circuit, the overpulse generator structured to accept a desired amplifier output level, drive the DAC at a first level for a first time period, and drive the DAC at a second level for a second time period immediately subsequent to the first time period, the first level having a greater magnitude than the second level; and a DUT having an input coupled to the output of the power supply of the test and measurement device.

Example 22 is a test system according to Example 21 in which the output impedance of the power supply of the test and measurement device is less than 100 milliohms, and in which the input impedance of the DUT is at least one ohm.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the invention have been illustrated and described for purposes of illustration, it will be understood that various modifications may be made without departing from the spirit and scope of the invention. Accordingly, the invention should not be limited except as by the appended claims.

The invention claimed is:

1. A power supply in a test and measurement device, comprising:
   a stimulus generator having an output coupled to an amplifier in which an output signal from the stimulus generator controls an output level of the amplifier;
   a measurement circuit coupled to an output of the amplifier and structured to measure the amplifier output level; and
   an overpulse generator coupled to the stimulus generator and to the measurement circuit, the overpulse generator structured to:
      accept a desired amplifier output level;
      drive the stimulus generator at a first level for a first time period; and
      drive the stimulus generator at a second level for a second time period immediately subsequent to the first time period, the first level having a greater magnitude than the second level.

2. The power supply of claim 1 in which the desired amplifier output level remains constant during the first time period and the second time period, and in which the second time period starts as the actual amplifier output level approaches the desired amplifier output level.

3. The power supply of claim 1, in which the duration of first time period corresponds to a duration of a slew period of the amplifier.

4. The power supply of claim 1, in which the stimulus generator comprises a Digital to Analog Converter.

5. The power supply of claim 1, in which the stimulus generator comprises a Digital to Analog Converter, a first switch structured to selectively couple an output of the Digital to Analog Converter to a stimulus output, and a second switch structured to selectively couple the stimulus output to a reference voltage.

6. The power supply of claim 1, in which the stimulus generator is a voltage generator, and further comprising:
   a current stimulus generator having an output coupled to the amplifier, the current stimulus generator structured to cause the power supply to generate a current level based on the desired amplifier output level.

7. The power supply of claim 6, in which the current stimulus generator comprises a Digital to Analog Converter, a first switch structured to selectively couple an output of the Digital to Analog Converter to a stimulus output, and a second switch structured to selectively couple the stimulus output to a reference voltage.

8. The power supply of claim 1, in which the measurement circuit comprises:
   a voltage measuring circuit structured to measure a voltage of the amplifier output; and
   a current measuring circuit structured to measure a current of the amplifier output.

9. The power supply of claim 1, in which the magnitude of the first level is at least two times the magnitude of the second level.

10. The power supply of claim 1, in which the magnitude of the first level is at least 1000 times the magnitude of the second level.

11. The power supply of claim 1, in which the desired amplifier output level is user selected.

12. The power supply of claim 1, in which the desired amplifier output level is determined by a processor and without user intervention.

13. A method of driving an amplifier within a power supply of a test and measurement device, the power supply including a stimulus coupled to an amplifier in which an output of the stimulus controls an output level of the amplifier, the method comprising:
   accepting a desired output level for the power supply;
   driving the stimulus at a first level for a first time period;
   measuring the output level of the power supply; and
   when the measured output level of the power supply approaches the desired output level for the power supply, driving the stimulus at a second level by the overpulse generator for a second time period immediately subsequent to the first time period, the first level having a greater magnitude than the second level.

14. The method of driving an amplifier within a power supply according to claim 13, in which driving the stimulus at a first level comprises coupling an output of the stimulus to a reference voltage.

15. The method of driving an amplifier within a power supply according to claim 14, in which driving the stimulus at a second level by the overpulse generator for a second time period comprises:
   disconnecting the stimulus output from the reference voltage; and
   connecting the stimulus output to a Digital to Analog Controller driven by the overpulse generator.

16. The method of driving an amplifier within a power supply according to claim 13, in which driving the stimulus at a first level comprises driving a voltage controlling DAC, and in which measuring the output level of the power supply comprises measuring an output voltage of the power supply.

17. The method of driving an amplifier within a power supply according to claim 13, in which driving the stimulus at a first level comprises driving a current controlling DAC, and in which measuring the output level of the power supply comprises measuring an output current of the power supply.

18. The method of driving an amplifier within a power supply according to claim 13, in which driving the stimulus at a first level comprises driving the stimulus at a level that is at least two times the magnitude of the second level.

19. The method of driving an amplifier within a power supply according to claim 13, in which accepting a desired output level for the power supply comprises accepting a user input.

20. The method of driving an amplifier within a power supply according to claim 13, in which accepting a desired output level for the power supply comprises accepting a level predetermined by a processor.

* * * * *